(12) United States Patent
Chen et al.

(10) Patent No.: US 6,351,364 B1
(45) Date of Patent: Feb. 26, 2002

(54) ELECTROSTATIC DISCHARGE PROTECTION CIRCUIT

(75) Inventors: Shiao-Shien Chen, Chung-Li; Tien-Hao Tang; Yu-Shyang Huang, both of Taipei Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/533,458

(22) Filed: Mar. 23, 2000

(30) Foreign Application Priority Data

Mar. 17, 2000 (TW) ........................ 89104921 A

(51) Int. Cl.[7] ............................ H02H 3/20; H02H 9/00
(52) U.S. Cl. ..................... 361/111; 361/56; 257/355
(58) Field of Search ............................ 361/66, 67, 64, 361/111, 56, 58, 118; 257/499, 355, 536, 363

(56) References Cited

U.S. PATENT DOCUMENTS 5,361,185 A * 11/1994 Yu .............................. 361/111
5,905,614 A * 5/1999 Colombo ..................... 361/56
6,091,594 A * 7/2000 Williamson et al. ........ 361/111

* cited by examiner

*Primary Examiner*—Rajnikant B. Patel
(74) *Attorney, Agent, or Firm*—Thomas, Kayden, Horstemeyer & Risley

(57) ABSTRACT

An electrostatic discharge (ESD) protection circuit. A first NMOS transistor has a drain terminal connected to an I/O pad and a gate terminal connected to a voltage source. A second NMOS transistor has a drain terminal connected to a source terminal of the first NMOS transistor and a source and a gate terminal connected to a ground voltage. A third NMOS transistor has a source terminal connected to the I/O pad, a drain terminal connected to the voltage source and a gate and a substrate terminal connected to the ground voltage. A first PMOS transistor has a drain terminal connected to the ground voltage and a substrate terminal of the second NMOS transistor, a source and a substrate terminal connected to the I/O pad and a gate terminal connected to the voltage source. And, a second PMOS transistor has a source and a gate terminal connected to the voltage source, a drain terminal connected to the I/O pad and a substrate terminal connected to a drain terminal of the third NMOS transistor. Under ESD stress conditions, the cascode parasitic BJT can be turned on in advance by triggering a substrate, so that the ESD protection ability can be thus improved.

3 Claims, 5 Drawing Sheets

ELECTROSTATIC DISCHARGE PROTECTION CIRCUIT

CROSS-REFERENCE TO RELATED APPLICATION

This application claims the priority benefit of Taiwan application serial no. 89104921, filed Mar. 17, 2000.

BACKGROUND OF THE INVENTION

1. Field of the Invention

The present invention relates to an electrostatic discharge (ESD) protection circuit. More particularly, the present invention relates to an ESD protection circuit, of which the parasitic bipolar junction transistor (BJT) can be turned on in advance by triggering a substrate under ESD stress conditions, so that the ESD capacity can be enhanced.

2. Description of the Related Art

Electrostatic discharge (ESD) can easily damage IC devices such as DRAMs and SRAMs during both manufacture and operation. A person walking on a carpet, for instance, can carry up to several thousand volts of electrostatic charge under high relative humidity (RH) conditions and over 10,000 volts under low RH conditions. If such a person touches an IC package, the electrostatic charge on his/her body is instantly discharged to the IC package, thus causing ESD damage to the internal circuitry of the IC package. A widely used solution to this problem is to provide an on-chip ESD protection circuit around each I/O pad of the IC package.

One drawback to the prior art, however, is that when the IC device is fabricated by scaled down technology, such as the deep-submicron CMOS process, the gate-oxide structure is reduced in thickness. This causes the breakdown voltage of the gate-oxide structure to be close to or below the breakdown voltage at the source/drain junction, thus degrading the ESD protection capability. The internal circuitry of an IC device is typically drawn in accordance with the Minimum Design Rules. Therefore, the various semiconductor components of an IC device are designed to have the minimum size. This practice, however, makes some components vulnerable to ESD stress when these components are further scaled down. For this reason, a highly integrated IC device fabricated by deep-submicron process is particularly vulnerable to ESD. Therefore, in the IC industry, much research effort has been directed to ESD protection for integrated circuitry.

FIG. 1 is a circuit diagram for a conventional cascode ESD protection circuit disposed between an I/O pad 10 and an internal circuit 12. As shown in FIG. 1, the conventional cascode ESD protection circuit comprises two NMOS transistors 14 and 16 and a PMOS transistor 18.

According to the circuit structure in FIG. 1, though the NMOS transistor 14 and 16 connected in serial can enhance the reliability, the drain-source voltage Vds of NMOS transistor 14 and 16 will be decreased and the drain junction avalanche effect will get worse due to the result of bias voltage and the effect of coupling voltage, thus the ESD protection ability will get worse than the conventional gated P-N structure. Additionally, the reason for turning on the parasitic bipolar junction transistor 20 between the drain of NMOS transistor 14 and the source of NMOS transistor 16 is the trigger voltage must be increased (that is, the snapback trigger voltage increased), as a result, the ESD protection ability will be reduced.

Therefore, in a mixed I/O circuit, how to improve the reliability and the ESD protection ability simultaneously for a cascode circuit is very important.

SUMMARY OF THE INVENTION

The invention provides an electrostatic discharge (ESD) protection circuit disposed between an I/O pad and an internal circuit. The ESD protection circuit comprises three NMOS transistors and two PMOS transistors. A first NMOS transistor has a drain terminal connected to the I/O pad and a gate terminal connected to a voltage source. A second NMOS transistor has a drain terminal connected to a source terminal of the first NMOS transistor and a source and a gate terminal connected to a ground voltage. A third NMOS transistor has a source terminal connected to the I/O pad, a drain terminal connected to the voltage source and a gate and a substrate terminal connected to the ground voltage. A first PMOS transistor has a drain terminal connected to the ground voltage and a substrate terminal of the second NMOS transistor, a source and a substrate terminal connected to the I/O pad and a gate terminal connected to the voltage source. And, a second PMOS transistor has a source and a gate terminal connected to the voltage source, a drain terminal connected to the I/O pad and a substrate terminal connected to a drain terminal of the third NMOS transistor. Furthermore, the ESD protection circuit of the invention further comprises a first resistor and a second resistor, wherein the first resistor is disposed between the drain terminal of the first PMOS transistor and the ground voltage, and the second resistor is disposed between the drain terminal of the three NMOS transistor and the voltage source.

According to the ESD protection circuit of the invention, whether a positive voltage stress is applied to ground voltage VSS or a negative voltage stress is applied to voltage source VDD, both the parasitic BJT of the second NMOS transistor and the second PMOS transistor can be turned on in advance by triggering the junctions between their substrates and sources, and the ESD stress then can be discharged to the ground voltage VSS and the voltage source VDD, so that the capacity of the ESD protection circuit in this invention is thus improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
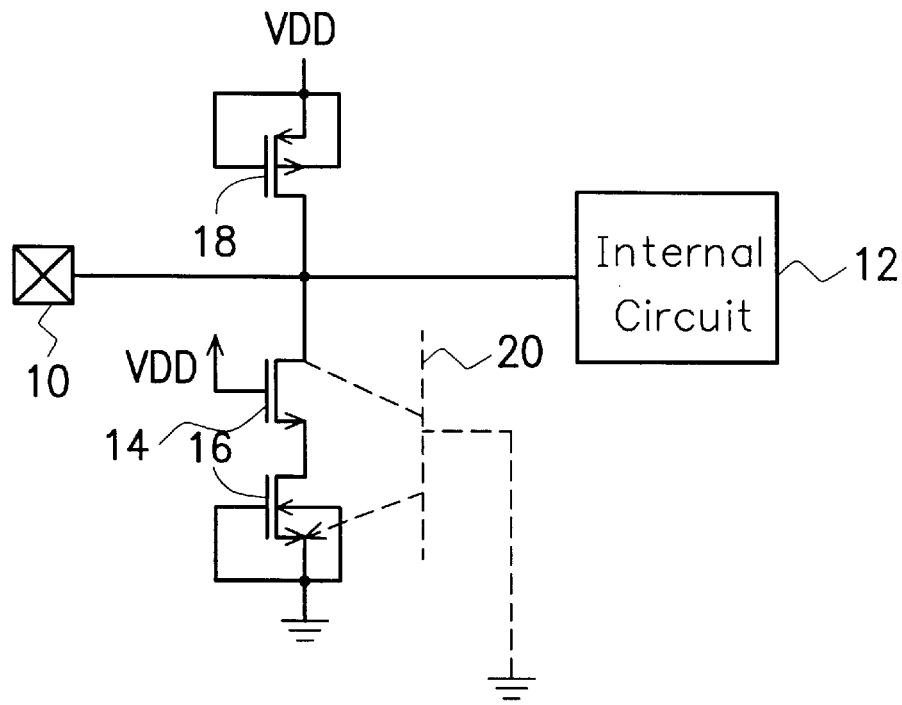
FIG. 1 is a circuit diagram for a conventional cascode ESD protection circuit.

Reference will now be made in detail to the present preferred embodiments of the invention, examples of which are illustrated in the accompanying drawings.

Wherever possible, the same reference numbers are used in the drawings and the description to refer to the same or like parts.

Figure 2:
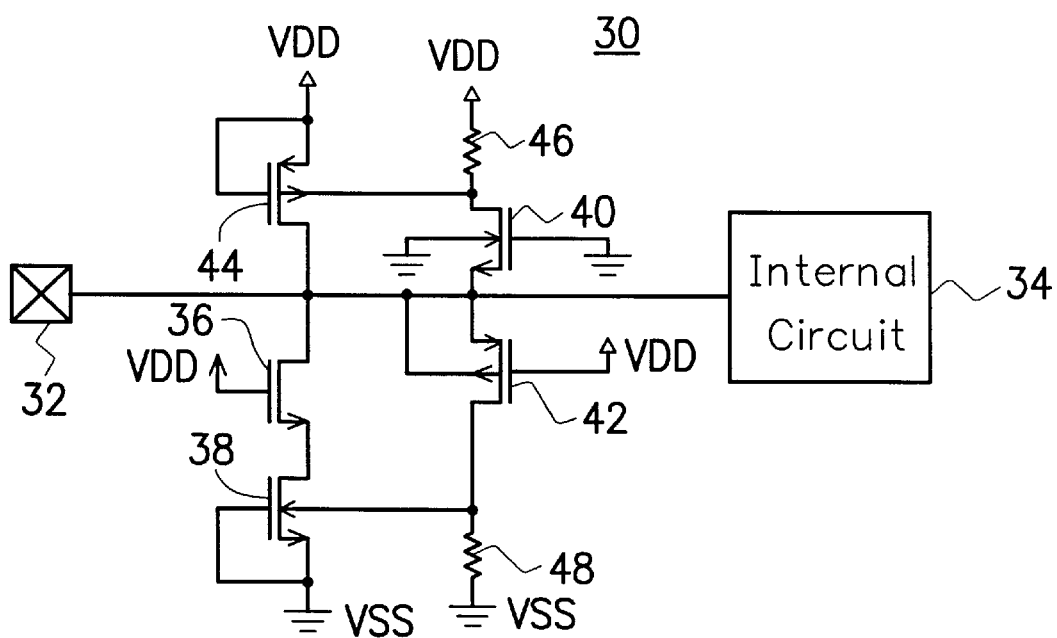
FIG. 2 is a circuit diagram of an ESD protection circuit according to a preferred embodiment of the present invention.

FIG. 2 is a circuit diagram of an ESD protection circuit according to a preferred embodiment of the present invention.

As shown in FIG. 2, the ESD protection circuit 30 is disposed between an I/O pad 32 and an internal circuit 34. The ESD protection circuit 30 comprises three NMOS transistors 36, 38 and 40 and two PMOS transistors 42, 44. The ESD protection circuit 30 further comprises two resistors 46 and 48 for limiting current.

The connection relationship is introduced as follows. The NMOS transistor 36 has a drain terminal coupled to the I/O pad 32, a gate terminal coupled to a voltage source VDD (referred to as the voltage source pad) and a source terminal coupled to a drain terminal of the NMOS transistor 38. The NMOS transistor 38 has a gate and a source terminal coupled to the ground voltage VSS (referred to as the ground pad). The NMOS transistor 40 has a source terminal coupled to the I/O pad 32, a gate and a substrate terminal coupled to the ground voltage VSS and a drain terminal coupled to a substrate terminal of the PMOS transistor 44. PMOS transistor 42 has a source and a substrate terminal coupled to the I/O pad 32 and a gate terminal coupled to the voltage source VDD. The PMOS transistor 44 has a source and a gate terminal coupled to the voltage source VDD and a drain terminal coupled to the I/O pad 32. The resistor 46 is disposed between the voltage source VDD and the substrate of the PMOS transistor 44. The resistor 48 is disposed between the ground voltage source VSS and the substrate of the NMOS transistor 38.

Figure 3:
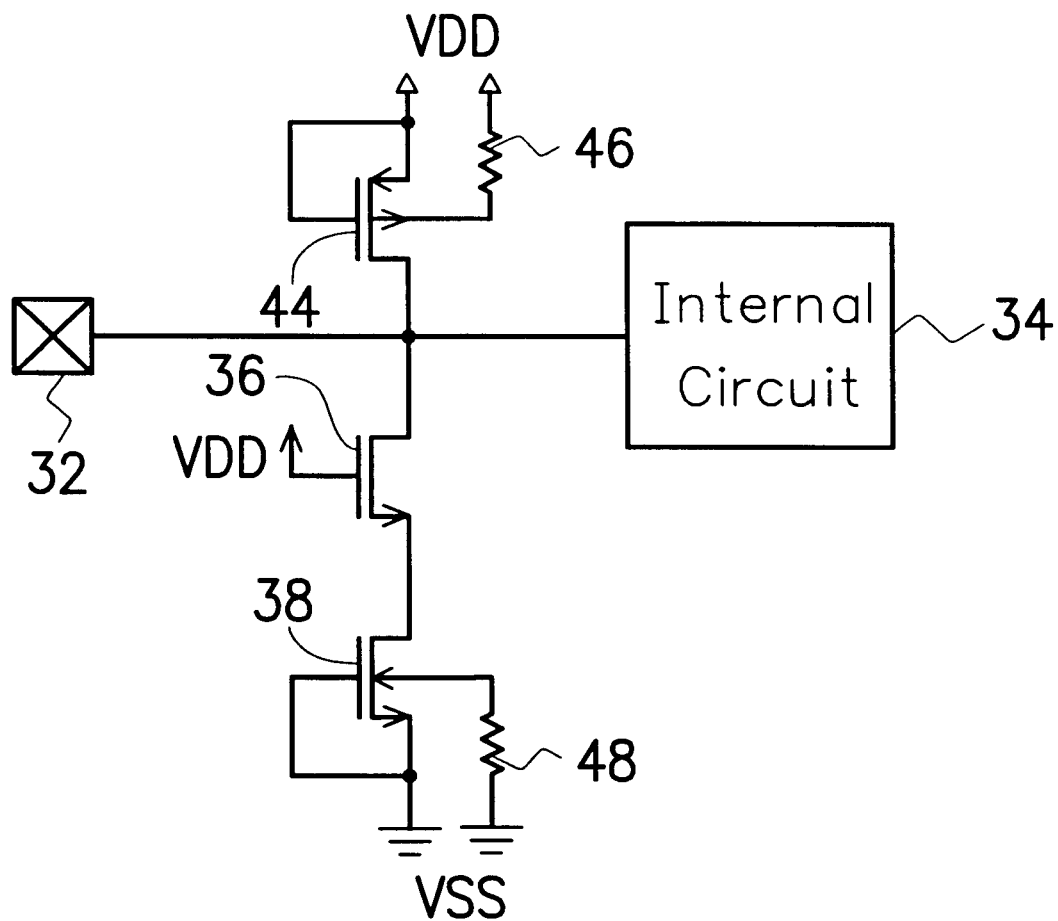
FIG. 3 is a circuit diagram of an ESD protection circuit according to the present invention under a normal operation condition.

Under normal operation conditions, because the gate of NMOS transistor 40 is coupled to the ground voltage VSS and the gate of PMOS transistor 42 is coupled to the voltage source VDD, the NMOS transistor 40 and the PMOS transistor 42 are turned off. Thus, as shown in FIG. 3, the structure of ESD protection circuit 30 is the same as the conventional structure. Furthermore, the NMOS transistor 36 and the PMOS transistor 44 are also turned off; therefore, the leakage current path is not existent, and the normal operation conditions are not affected.

Figure 4A:
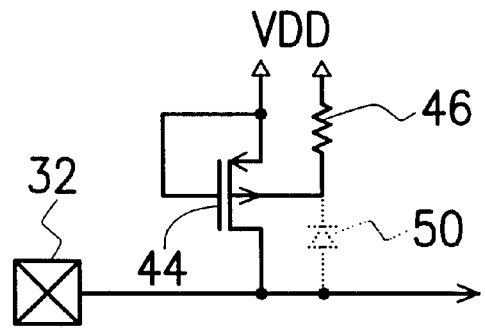
FIG. 4A is a circuit diagram of an ESD protection circuit according to the present invention under a condition of a positive stress voltage to a voltage source pad.

FIG. 4A shows the structure of ESD protection circuit 30 when ESD occurs, taking a positive stress to VDD as an example. Since the parasitic diode 50 across the drain and substrate terminal of the PMOS transistor 44 has a forward bias, the positive stress voltage on the I/O pad 32 can be discharged to the voltage source pad VDD through the parasitic diode 50. That is, the parasitic diode 50 of the PMOS transistor 44 provides an electric discharge path.

Figure 4B:
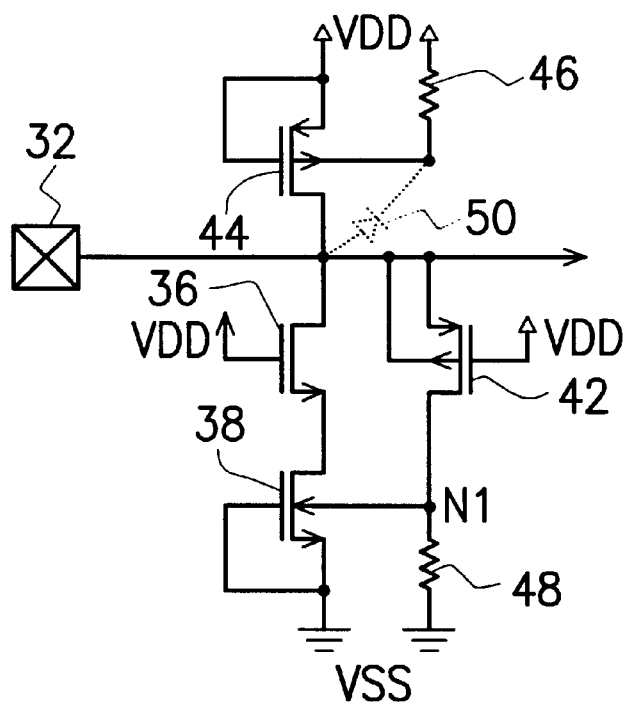
FIG. 4B is a circuit diagram of an ESD protection circuit according to the present invention under a condition of a positive stress voltage to a ground pad.

On the other hand, FIG. 4B shows the structure of ESD protection circuit 30 under a positive stress to VSS, for example. The voltage source pad VDD and the ground pad VSS are in a floating state (under an abnormal operation condition), so that the positive stress voltage imported through I/O pad 32 can be coupled to the voltage source pad VDD via the parasitic diode 50 between the drain and substrate of PMOS transistor 44 through resistor 46. Then, the positive stress voltage flowing into the voltage source pad VDD can be transmitted to the gate of PMOS transistor 42. Thereafter, the positive stress voltage on the gate of PMOS transistor 42 can be coupled to its drain as well as to a node N1 in FIG. 4B through the overlap capacitor between drain and gate of PMOS transistor 42, so as to trigger the junction between the substrate and source of NMOS transistor 38. As a result, the parasitic BJT of NMOS transistor 38 is turned on and the positive stress voltage imported through I/O pad 32 can be discharged to ground pad VSS through NMOS transistors 36 and 38.

Figure 5A:
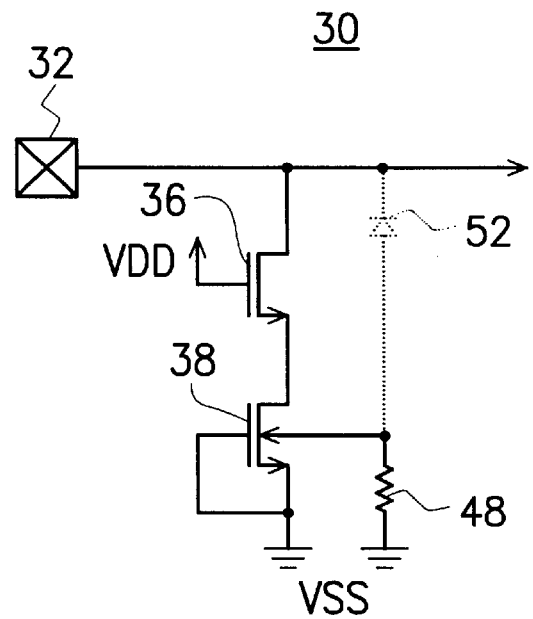
FIG. 5A is a circuit diagram of an ESD protection circuit according to the present invention under a condition of a negative stress voltage to a ground pad.

The same result occurs under a negative stress condition. FIG. 5A shows the structure of ESD protection circuit 30 when the electrostatic discharge of a negative stress occurs, taking a negative stress to VSS as an example. The parasitic diode 52 of the NMOS transistor 38 provides an electric discharge path, so that the negative stress voltage imported through the I/O pad 32 can be discharged to the ground pad VSS through the parasitic diode 52.

Figure 5B:
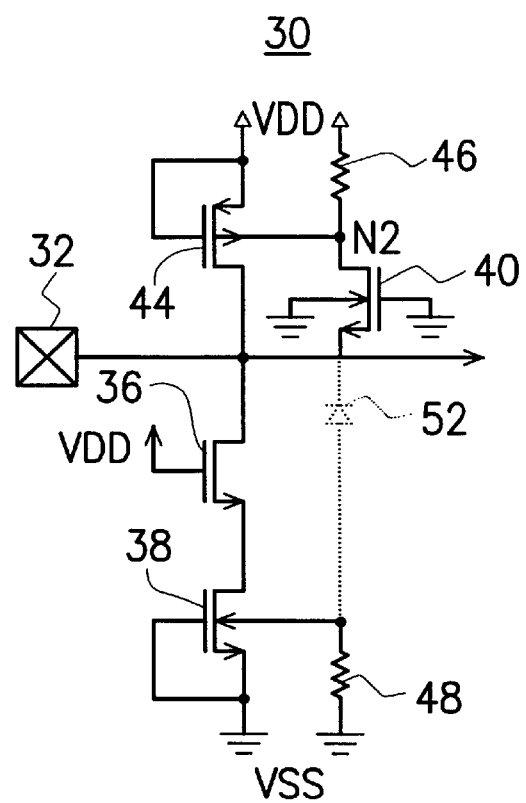
FIG. 5B is a circuit diagram of an ESD protection circuit according to the present invention under a condition of a negative stress voltage to a voltage source pad.

On the other hand, FIG. 5B shows the structure of ESD protection circuit 30 with a negative stress to VDD, for example. Similarly, the voltage source pad VDD and the ground pad VSS are in floating state (under an abnormal operation condition), so that the negative stress voltage imported through I/O pad 32 can be coupled to the ground pad VSS via the parasitic diode 52 between the drain-substrate of NMOS transistor 38 through resistor 48. Then, the negative stress voltage flowing into the ground pad VSS can be transmitted to the gate of NMOS transistor 40. Thereafter, the negative stress voltage on the gate of NMOS transistor 40 can be coupled to its drain as well as a node N2 in FIG. 5B through the overlap capacitor between the drain and gate of NMOS transistor 40, so as to trigger the junction between the substrate and source of PMOS transistor 44. As a result, the parasitic BJT of PMOS transistor 44 is turned on and the negative stress voltage imported through the I/O pad 32 can be discharged to voltage source pad VDD through PMOS transistor 44.

As described above, the parasitic BJT in the ESD protection circuit 30 of the invention can be turned on in advance by triggering the substrate under ESD stress conditions, so that the ESD protection ability can be enhanced. In addition, according to the circuit structure of the invention without increasing additional masks for ion implant and process steps, so that the process competition can be enhanced and the cost can be reduced.

Figure 6:
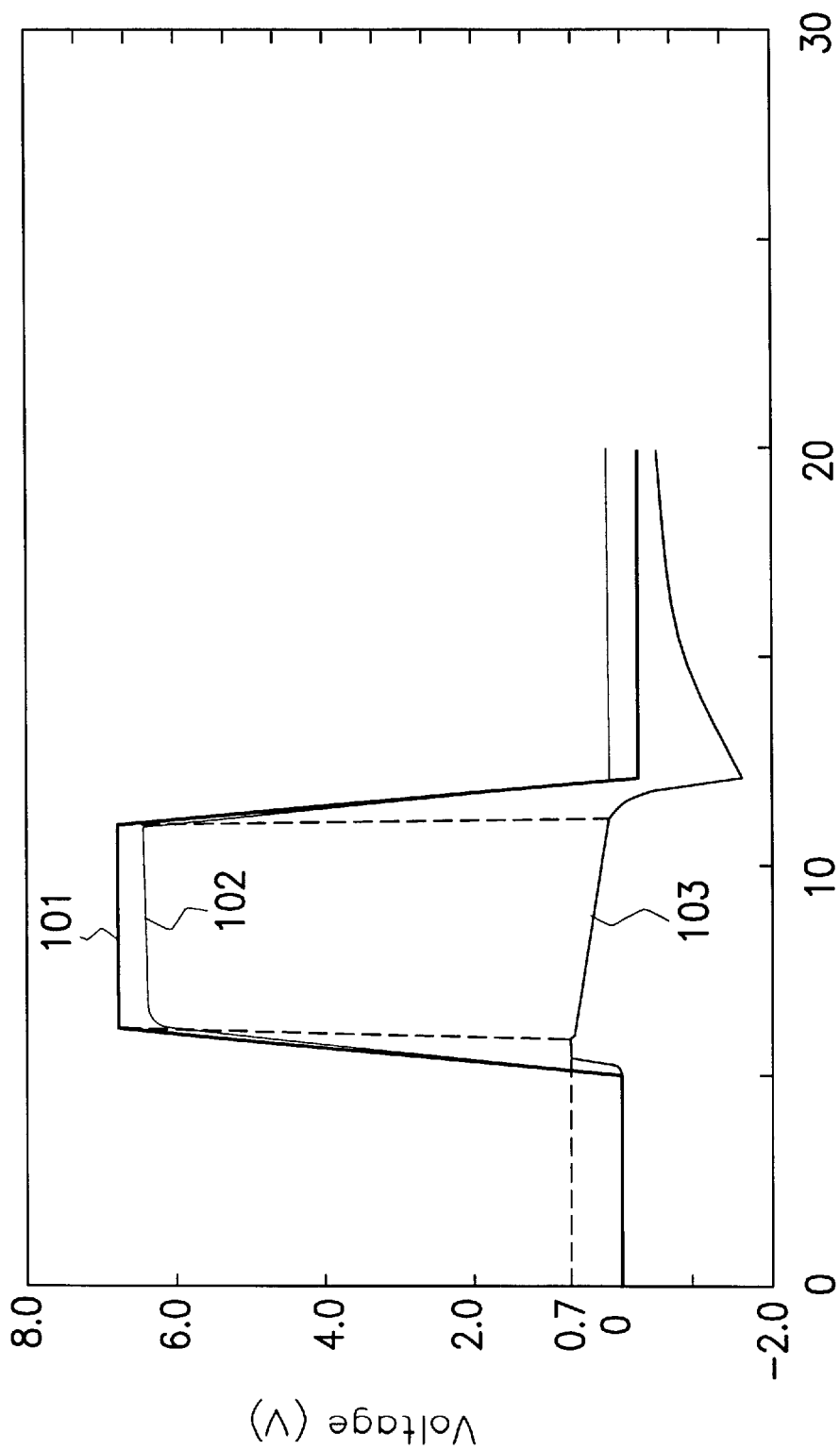
FIG. 6 is a fluctuation diagram of various nodes in an ESD protection circuit according to the present invention under a condition of a positive stress voltage to a ground pad.

Referring to FIG. 4B and FIG. 6, FIG. 6 is a fluctuation diagram of various nodes in an ESD protection circuit according to the present invention under a condition of a positive stress voltage to a ground pad.

In FIG. 6, a curve 101 represents the relationship of voltage-time (V-T) on the I/O pad 32, a curve 102 represents the relationship of voltage-time on the voltage source pad VDD and a curve 103 represents the relationship of voltage-time on the node N1. Obviously, when the voltage of I/O pad 32 reaches 7 volts (V), the voltage of node N1 reaches about 0.7 V, so that the NMOS transistor 38 is turned on rapidly in a transient period of time (about 7 ns) and the positive stress voltage from the I/O pad 32 can be discharged to the ground pad VSS via the NMOS transistor 38.

In summary, according to the ESD protection circuit of the invention, whether a positive voltage stress is applied to ground voltage VSS or a negative voltage stress is applied to voltage source VDD, both the parasitic BJT of the NMOS transistor 38 and the PMOS transistor 44 can be turned on in advance by triggering the junctions between their substrates and sources, and the ESD stress then can be discharged to the ground voltage VSS and the voltage source VDD. Hence, the capacity of the ESD protection circuit in this invention is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge protection circuit disposed between an I/O pad and an internal circuit, comprising:

a first NMOS transistor whose drain terminal is connected to the I/O pad and whose gate terminal is connected to a voltage source;

a second NMOS transistor whose drain terminal is connected to a source terminal of the first NMOS transistor and whose source and gate terminal are connected to a ground voltage;

a third NMOS transistor whose source terminal is connected to the I/O pad, whose drain terminal is connected to the voltage source and whose gate and substrate terminal are connected to the ground voltage;

a first PMOS transistor whose drain terminal is connected to the ground voltage and a substrate terminal of the second NMOS transistor, whose source and substrate terminal are connected to the I/O pad and whose gate terminal is connected to the voltage source; and a second PMOS transistor whose source and gate terminal are connected to the voltage source, whose drain terminal is connected to the I/O pad and whose substrate terminal is connected to a drain terminal of the third NMOS transistor.

2. The electrostatic discharge protection circuit of claim 1, further comprising a resistor disposed between the drain terminal of the first PMOS transistor and the ground voltage.

3. The electrostatic discharge protection circuit of claim 1, further comprising a resistor disposed between the drain terminal of the third NMOS transistor and the voltage source.

\* \* \* \* \*